United States Patent
Leddige et al.

(10) Patent No.: US 7,514,773 B2
(45) Date of Patent: Apr. 7, 2009

(54) SYSTEMS AND ARRANGEMENTS FOR INTERCONNECTING INTEGRATED CIRCUIT DIES

(75) Inventors: Michael Leddige, Beaverton, OR (US); James A. McCall, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 172 days.

(21) Appl. No.: 11/513,850

(22) Filed: Aug. 31, 2006

(65) Prior Publication Data
US 2008/0054488 A1 Mar. 6, 2008

(51) Int. Cl.
*H01L 23/02* (2006.01)
*H01L 23/34* (2006.01)

(52) U.S. Cl. .................. 257/686; 257/685; 257/723; 257/724; 257/E23.078

(58) Field of Classification Search ............. 257/685, 257/686, 723, 724, E23.078
See application file for complete search history.

(56) References Cited

U.S. PATENT DOCUMENTS

| | | | |
|---|---|---|---|
| 5,345,205 A * | 9/1994 | Kornrumpf | 333/246 |
| 5,448,511 A * | 9/1995 | Paurus et al. | 365/52 |
| 6,414,381 B1 | 7/2002 | Takeda | |
| 6,699,730 B2 * | 3/2004 | Kim et al. | 438/107 |
| 7,064,426 B2 * | 6/2006 | Karnezos | 257/686 |
| 7,071,420 B2 | 7/2006 | Chambers | |
| 7,358,444 B2 * | 4/2008 | Nickerson et al. | 174/254 |
| 2002/0114143 A1 * | 8/2002 | Morrison et al. | 361/749 |
| 2003/0080438 A1 * | 5/2003 | Matsuura et al. | 257/778 |
| 2004/0238936 A1 * | 12/2004 | Rumer et al. | 257/688 |
| 2004/0264148 A1 * | 12/2004 | Burdick et al. | 361/748 |
| 2006/0077644 A1 * | 4/2006 | Nickerson et al. | 361/767 |
| 2006/0157842 A1 | 7/2006 | Goodwin | |
| 2006/0175693 A1 | 8/2006 | Cady et al. | |
| 2006/0255446 A1 | 11/2006 | Wehrly | |
| 2006/0286717 A1 * | 12/2006 | Solberg et al. | 438/113 |
| 2007/0152344 A1 * | 7/2007 | Zingher et al. | 257/777 |

\* cited by examiner

*Primary Examiner*—Ngan Ngo
(74) *Attorney, Agent, or Firm*—Schubert Osterrieder & Nickelson PLLC

(57) ABSTRACT

An integrated circuit interconnection system is disclosed. The system can include a first integrated circuit die having a first electrode configuration and a second integrated die having the same or a substantially similar electrode configuration. The system can also include a multilayer flexible cable having a first side and a second side that has substantially parallel conductors running along the cable. At least a portion of one of the parallel conductors can be exposed on the first side and/or the second side, such that the first and second integrated circuit die can be connected to both the first side and the second side of the multilayer flexible cable. The cable can be folded to provide a dense interconnect for stacked memory configurations.

14 Claims, 4 Drawing Sheets

SYSTEMS AND ARRANGEMENTS FOR INTERCONNECTING INTEGRATED CIRCUIT DIES

FIELD

The present disclosure relates to integrated circuits. More particularly, embodiments of the present disclosure are in the field of interconnecting and securing integrated circuits.

BACKGROUND

Generally, new developments in, technology allow electronic device to provide increased functionally in a smaller package. For example, digital cameras, camera phones, movie picture experts group layer three (MP3) complaint audio devices, IPODs®, miniature personal computers, and movie cameras are ever increasing in features and ever decreasing in size. The electronic devices listed above, generally require a significant amount of memory, and thus typically require a significant number of memory integrated circuits (IC)s or memory chips. Accordingly, incorporating a larger number of ICs into smaller packages continues to be a design goal for many.

Packaging and interconnecting a large number of ICs within a sophisticated, high density electronic device, such as a camera phone presents many design challenges. Such design challenges include electrically interconnecting the ICs in tight spaces, allowing for adequate cooling of the ICs, and ensuring that vibration and thermal expansion due to heating does not break or fracture the electrical interconnections between the devices.

Advances in technology and in manufacturing equipment have allowed ICs to become physically larger in size. Generally, the larger the IC, the more functions and features that the IC can provide. However, there is a practical and/or economic limit to the maximum size of an IC. For example, as the die on which the IC gets manufactured gets larger, the reliability or yield of each batch of ICs on each wafer can significantly decrease. Second, semiconductor manufacturing equipment often has limitations regarding the maximum size of the die that it can cut from a wafer and handle during the manufacturing and testing process. Third, testing and assembling large die requires specialized manufacturing and testing equipment.

Thus, for physically larger ICs, not only is the number of ICs that can be manufactured on wafer reduced, but the yield from each wafer is typically greatly reduced. Low yields greatly increase the cost of individual IC devices, because the cost to manufacture the wafer must be allocated to the few acceptable IC devices produced. Because larger die are generally much more expensive, designers continue to work on ways to efficiently interconnect several smaller IC die.

To reduce the size of electronic devices, achieve the desired functionality, and provide an economical product, designers commonly utilize smaller ICs and tightly package the IC's on circuit boards within the device. Even relatively small ICs have hundreds of conductive pads that must be electrically interconnected to the circuit board such that the IC die can receive power, ground, data and control signals from other ICs. It can be appreciated that efficiently and reliably interconnecting hundreds of pads between multiple ICs in a small package can be a complex process.

Many vendors stack ICs horizontally or in a parallel configuration with the mounting circuit board and with other ICs. For example, is it common for a state-of-the-art device to have four ICs stacked on top of each other in various locations on a circuit board. In such a configuration multiple individual cables are looped from IC to IC to interconnect the ICs, and a stack of four IC die often requires precision assemble of six or more individual cables.

Some manufacturers place the IC die in chip carriers, glue and wire-bond the die to the chip carrier and place the solder pads of the chip carrier on the outside or periphery of the actual chip carrier. This makes the packaged IC actually larger than a configuration where the pads are placed directly underneath the individual die and no chip carriers are utilized. Others utilize "flip chip technology where the chip is a surface mounted to an organic chip carrier and again the pads are often placed on the outside edge of the chip carrier.

Interconnecting stacked IC creates many design challenges. For example impedance matching of conductors, robust solder connections, mechanical retention of the ICs and efficient assembly of these IC packages are all important considerations. More particularly, it is tedious task to make electrical connections from "microscopic" pads on an IC die to other ICs.

As stated above, in most electronic devices there is an ever increasing need for memory capacity and most new devices require a significant number of memory ICs. Generally, memory systems can require duplicate or numerous busses and conductive paths. Such a design requires twice the routing density than conventional designs. Most designers find it very challenging to assemble and interconnect so many ICs in such limited space and provide compact impedance matched routing for the electrical signals.

DETAILED DESCRIPTION OF EMBODIMENTS

Figure 1:
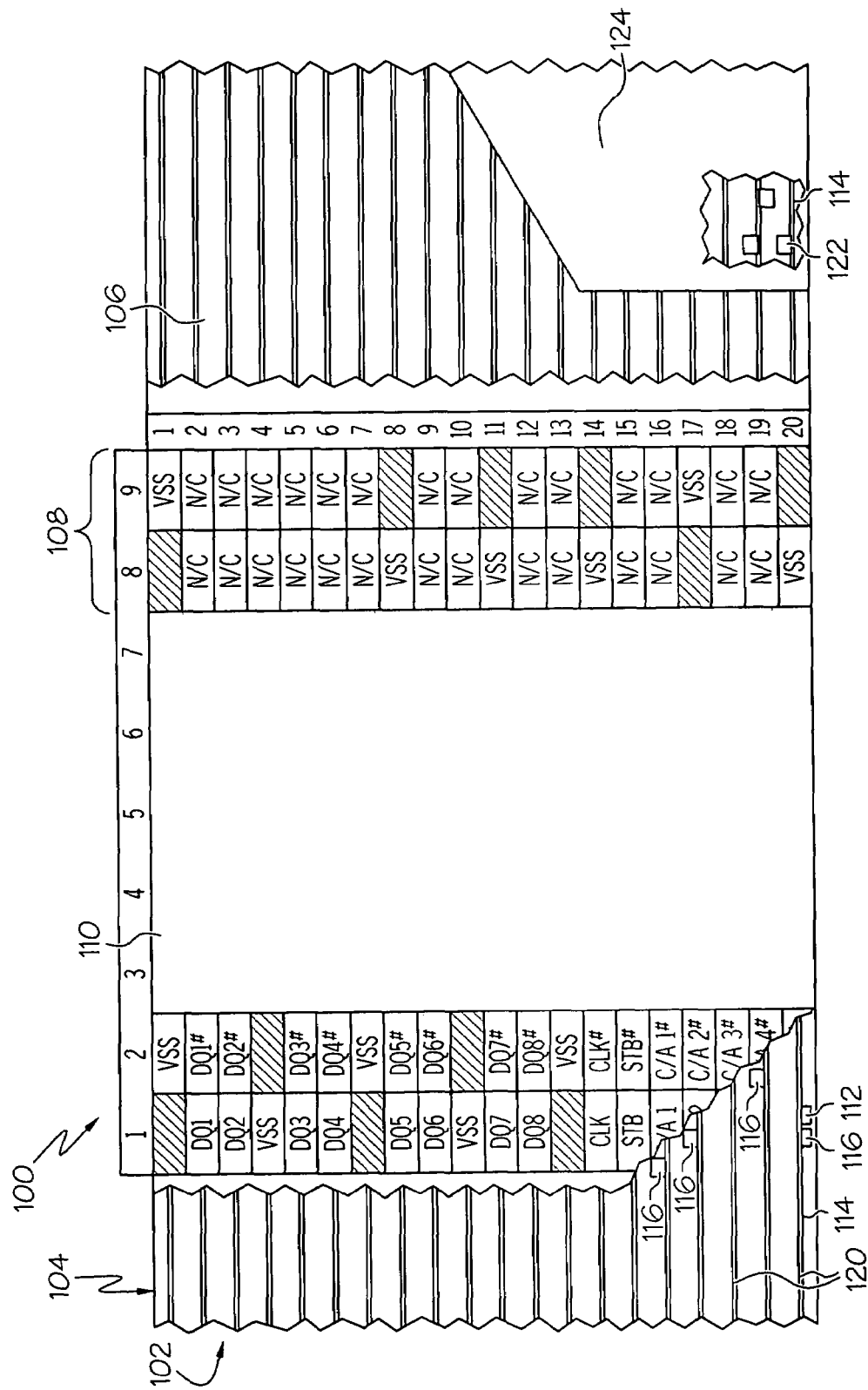
FIG. 1 depicts an embodiment of a "pin-out" of an integrated circuit die with an interconnect cable.

The following is a detailed description of embodiments of the disclosure depicted in the accompanying drawings. The embodiments are introduced in such detail as to clearly communicate the disclosure. However, the embodiment(s) presented herein are merely illustrative, and are not intended to limit the anticipated variations of such embodiments; on the contrary, the disclosure is to cover all modifications, equivalents, and alternatives falling within the spirit and scope of the appended claims. The detailed descriptions below are designed to make such embodiments obvious to those of ordinary skill in the art.

The present disclosure and some of its features have been described in detail for some embodiments. It should be understood that various changes, substitutions and alterations can be made herein without departing from the spirit and scope of the disclosure as defined by the appended claims. An embodiment of the disclosure may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. One of ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

Many electronic devices require a significant amount of memory. However placing numerous memory integrated circuits (IC)s directly to a circuit board can require a relatively large amount of circuit board area. Such a large circuit board area is not available in small handheld electronic devices. Thus, stacking of ICs on top of each other is one option for increasing the density of ICs in small devices. Also, the stacking of ICs can provide additional benefits, for example, shorter impedance matched conductors allow for faster data rates.

In one embodiment of the present disclosure, an IC die set interconnection system is disclosed. The system can include a first chip carrier having a first electrode or pad configuration and a second chip carrier having the same or a substantially similar electrode configuration. The system can also include a multilayer flexible cable having a first side and a second side that has substantially parallel conductors running along the cable. The cable can have vias exposed on the first side and the second side of the cable, such that the chip carriers can connected with the vias and the conductors on both sides of the cable.

The conductors can also be cut such that different segments of the conductors can be utilized exclusively to interconnect different chip carriers. This configuration allows an output bus on the first chip carrier to be connected to an input bus on the second chip carrier and it also allows an output bus of the second chip carrier to be connected to a secondary input bus on the first chip carrier, where the bus conductors can lie in parallel, eliminating the need for conductors to cross over each other, or eliminating the requirement to twist the cable as it interconnects busses of chip carriers.

In one embodiment, after chip carriers are connected to both sides of the cable, the cable can be folded or bend in a half circle to place the second chip carrier on top of the first chip carrier. After folding the cable, a surface of the second chip carrier can be secured to a surface of the first chip carrier such that the chip carriers become "stacked" in a parallel configuration. The first chip carrier can contain an IC die that can operate as a repeater circuit and the second chip carrier can mount an IC that can operate as a memory circuit that is a non-repeater circuit. In this configuration, functionally identical chips can be wired differently and perform different functions in a memory array.

In another embodiment, an interconnect system is disclosed that includes a flexible electrical interconnect member having a first side and a second side, a plurality of parallel conductors for conveying a set of signals and vias for exposing the parallel conductors on the first and second side. The system can further include a first IC die having a first set of electrodes disposed to connect with the plurality of parallel conductors on the first side of the flexible electrical interconnect member such that the first die can receive the set of signals. This embodiment can further include a second IC die having a second set of electrodes disposed to connect with the second side of the flexible electrical interconnect member and with the set of signals.

In addition, a third IC die can have a third set of electrodes disposed to connect with the first side of the cable, wherein the third IC die can be placed on the first side of the cable.

Thus, the first die, second die and third die can all store data related to the set of signals and the first die can act as the repeater or "gateway" for the second and third or more memory IC die in the stack can provided redundant data storage.

In one embodiment, a circuit board or interconnect board can be included to mount the stacked dies and the flexible interconnect member. The second die can be placed in an inverted position such that the flexible electrical interconnect member is folded and turns through a three hundred sixty degree angle. In another embodiment, the IC die can be functionally similar, but due how they are interconnected they can perform different functions. The flexible electrical interconnect can be a polyamide based interposer cable with controlled impedances. The interconnect topology could be a star configuration where a single conductor or line branches into many conductors such that a single buss can supply identical signals to multiple ICs.

In yet another embodiment, a method for interconnecting ICs is disclosed. The method can include manufacturing an interposer structure with conductors that can provide a first data bus and a second data bus and vias at the surface of the cable can provide an interconnection to the pads or electrodes at the surface of the cable or interposer structure. A first IC die can be assembled to the first data bus and second data bus of the interposer, and a second die can be assembled to the second data bus of the interposer. The interposer can be folded onto itself, such that the first die is proximate to, or stacked on the second die. A primary input port on the first die can accept data on a first data bus and a primary output port of the first die can supply data on the second data bus to the second die and possibly many other die. An output port on the second die can supply the data received on the input data bus back to a secondary input port of the first die on a third data bus when requested by a memory controller.

Referring to FIG. 1, an enlarged view of a bottom side of an IC (IC) die carrier 110 or "chip carrier" with a cut away view of a multilayer flexible cable, (cable 102) that forms an interconnect system 100 is disclosed. The chip carrier 110 can be an organic chip carrier built with a resin based material with embedded conductors and vias. The chip carrier 110 can also be attached to the die with fine gold wires to pads on the IC die that are less than 60 microns apart. The organic chip carrier can also utilize "flip chip" technology, a specialized form of surface mount technology with dense pad spacing.

The cable 102 could be like a ribbon cable that can carry a high density of signals such that the cable 102 can interconnect multiple data busses to multiple IC die. The cable 102 could be made from a polyamide material that insulates copper traces. The copper traces can be manufactured such that at specific frequencies, the impedance of the copper traces matches the output impedance of the IC die carrier 110. Such impedance matching allows high data transfer rates on the cable 102 without a significant amount of data transmission errors and signal degradation.

Although an 80 pin periphery pattern for IC die carrier 110 is illustrated in FIG. 1, other patterns of different densities, such as a 144 pin pattern with pads uniformly distributed over the entire surface area of die could also be utilized in accordance with the teachings of this disclosure. In the illustration, the electrode configuration of the IC die carrier 110 could also be an electrode configuration of a die or an interposer where there is no need for a chip carrier.

Generally, during the manufacturing process many "identical" ICs are manufactured on a wafer. The wafer is then cut into small square die, wherein each die is technically identical, or can perform in a similar manner with similar electrical stimuli. Since most IC die are small and the connection pads of the IC die are very close together (measured by microns), it is relatively difficult to connect the very small pads or electrodes on the IC die directly to pads on a circuit board or to a standard cable. The density and spacing of pads on a die is often referred to as pitch.

In accordance with the present disclosure, FIG. 1 discloses a surface mounting or flip-chip mounting of IC die 110, and a portion of IC die 124 to and segment of an interposer cable 102. The cable 102 can have pads 112, 114 and 122 or electrodes that can be attached to electrodes of the IC die 110 and 124 in a soldering process. Such an attachment is illustrated for two IC die 110 and 124 however, it can be appreciated that multiple die can be attached to the cable 102 on each side at various locations such that many busses of many IC die can be interconnected via the cable 102.

Cable 102 can be a multilayer cable having hundreds of conductors such that hundreds of signals can be simultaneously carried by the cable 102. In the illustration, cable 102 has two conductors that are placed directly under each pad. For example, conductors 114 are placed directly underneath pads 112, 114, and 122. A higher density cable may have more than two conductors that below each pad. The multilayer cable 102 can have vias such as vias 116 or micro vias which measure less than 50 microns in diameter. Vias can create an electrical connection from an underlying layer of the cable 102 to the surface of the cable 102, such that the IC die 110 and 124 can connect with any layer of the cable 102.

Generally, a via can be a plated through hole or a wire that "runs" perpendicular to the conductors 120 and traverses insulative layers of the cable 102. A via can also interconnect conductors on various layers of the cable 102. Spacing of the conductors 120 and micro vias can allow room for the vias to traverse the cable without shorting to other conductors. For example, vias 116 can connect a conductor on a far side of the cable 102 to a pad on the cable 102, and to a pad on IC die 110. Although only a few vias are shown, hundreds of vias could be utilized to interconnect IC die 110 to the cable 102. Conductor 114 on the left and right side of the page can represent conductors on a bus that interconnects chip carrier 110 with chip carrier 124.

Figure 2:
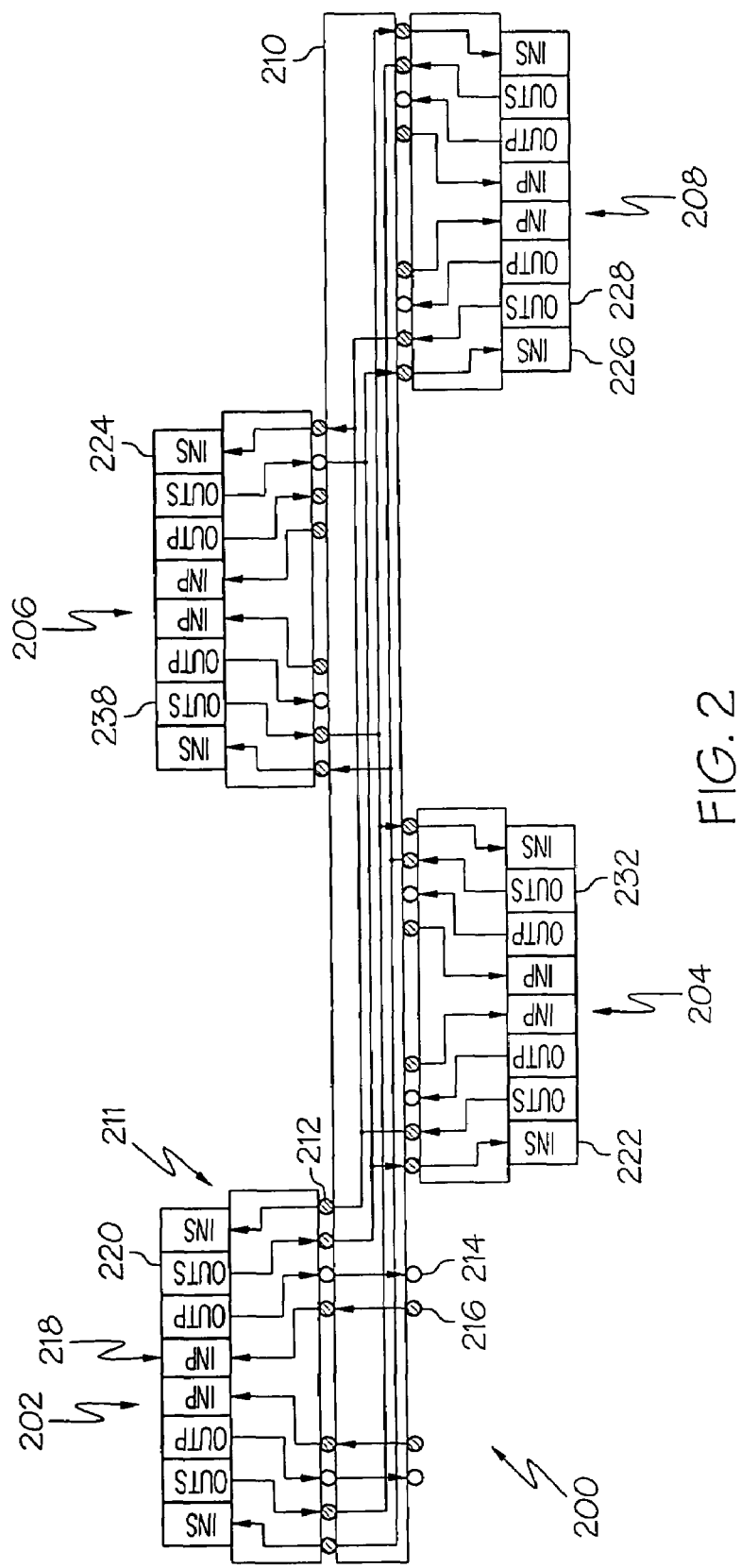
FIG. 2 illustrates an embodiment of integrated circuit die mounted alternately on each side of a flexible conductive cable.

Referring to FIG. 2, a plurality of dies, mounted on an interposer cable 210 to form an interconnect system 200 is disclosed. The plurality of dies can include first die 202, second die 204, third die 206 and fourth die 208, (dies 202-208). As with FIG. 1, the plurality of dies 202-208 could be placed within chip carriers such as chip carrier 211 or the die could be directly connected to the interposer 210 without parting form the present disclosure. It can be appreciated that a die connected directly to a cable without a chip carrier will be smaller and more compact. FIG. 2 can be an illustration of a preliminary manufacturing stage where dies 202-208 are assembled onto a first planar surface and a second planar surface of the interposer cable 210.

The interposer 210 can generally be a flexible substrate having a top and bottom planar surface. The interposer 210 can have, for example three or four layers of conductors and can have possibly over 50 conductors per layer. The interposer 210 can have a set of pads such as pad 112 that are configured in a predetermined pattern (for example, a predefined ball grid array pattern) such that conductors within interposer 210 can connect with, and interconnect dies 202-208. Many different attachment methods or topologies such as a ball grid array, a fine ball grid array, chip scale packages, thin quad flat packs, or any other interconnect topology could be utilized to interconnect the dies 202-208 with the conductors of the interposer 210.

The interposer 210 can have small vias that bring internal conductive paths or traces to the surface of the interposer 210. Pads can be placed where the vias reach the surface such that the electrodes or conductive pads on die 202-208 can be connected to selected conductors in the interposer 210. The pads can be spaced as close as 60 microns center to center. Dies 202-208 may by analog, digital or hybrid circuits for example microprocessors, microcontroller, application specific ICs, static or dynamic memory devices, radio frequency processing devices and the like.

In one embodiment, the die 202-208 could create a memory system. The memory system could utilize a fan out configuration provided by the interposer 210 where signals entering the interposer 210 on connections such as solder balls 214 and 216 could be selectively connected to specific inputs of die 202. Die 202 can be a repeater die or a base memory chip. In this embodiment interposer 210 can also connect the die 202 too other die depending on the location of vias, splices, cuts and pad connections of the interposer 210. Accordingly, die 202 could function as a repeater circuit and dies 204, 206 and 208 could function as non-repeater dies and create redundant storage.

In this "fan out" or "star" memory topology, die 202 or the "repeater" memory chip can be placed on the circuit board and the "non-repeater" memory ICs (i.e. 204-208) can be placed on top of, or can be stacked on die 202. The repeater die 202 can "fan out" an incoming signal to form a "stacked star" topology delivering a single signal to multiple memory ICs (i.e. dies 204-208) at multiple locations. This topology can connect a single point or transistor within a die to multiple locations along the interposer 210 utilizing the branching configuration.

In a star topology that stacks die 202-208, another mode of operation can also be utilized. In this configuration, each memory chip has separate input ports and output ports. The base memory chip (i.e. die 202 or the one on the bottom of the stack) or repeater IC will receive data from the memory controller (not shown) on its primary input port, store the data and provide a repeat transmission of the stored data sending it to all chips in the stack such as die 204-208 via a secondary output port to create the fan out topology.

The base chip die 202 can also send the stored data directly back to the controller on its primary output port in response to a request from the memory controller. Thus, all of the memory ICs that are connected to the interposer 210 can receive and store data identical to the data stored by the base repeater die 202. Such a configuration creates a significant routing density. Interposer 210 can accommodate such routing density with multiple layers, micro vias, cuts and splices.

Other stacked interconnect topologies could be provided for other data storage or data processing methodologies, sequences or process. For example, each memory chip can have separate input ports and separate output ports or dedicated input ports and dedicated input ports that transmit and receive to and from a single location. For example, the base die 202 can receive data from the memory controller (not shown) on its primary input port, store the data and provide a repeat transmission of the stored data on a multiple output ports, sending he data to all stacked packages on separate conductors. This may require additional ports and pad outs to those shown in the figures.

The stacked interconnect can support either a star topology with one sender and multiple receivers, or the interconnect could be configured as a daisy chain where a single transmit port can send data to a single receive port. Such an interconnect configuration may require multiple links via the solder balls or other interconnect structures to provide data to IC at the top of stack. For example, the data may take three different conductors, transmitters and receivers going up to the top of a stack with four ICs. In a daisy chain configuration, the ICs may not share busses but each bus on each chip can be interconnected by dedicated conductors.

The stacked interconnect can support either a star topology with one sender and multiple receivers or could be configured in a daisy chain where a single transmitter can send data to a single receiver. Such an interconnect configuration may require multiple links via the solder balls to provide data to the top of stack. For example, the data may take three different conductors going up to the top of a stack with four ICs. In a daisy chain configuration, the ICs are not connected in a fan out and do not share busses but each bus on each chip can be interconnected by dedicated conductors.

Notwithstanding the higher routing density of this type of system, all die 202-208 can be manufactured from the same batch to increase the volume of identical IC dies that can be utilized in a device. In this configuration the base package (die 202) can receive data from the memory controller on its primary input and send the data to other chips in the stack (die 204-208) via its secondary port. Then, when memory controller requests the stored data all of the chips connected to interposer 210, excluding the base package (die 202), can supply the stored data to die 202 on their secondary output.

Die 202 (base chip) can accept the stored/transmitted signals on their secondary input port and die 202 can send the data back to the memory controller via its primary output port. As stated above in this configuration, where all of the memory ICs have the same chip design and pin out routing the conductors between chips becomes complicated because of the linear nature of the conductors in the interposer and the identical pin outs of the IC die.

In this embodiment, a write data bus (that writes data to all dies (202-208)) from a circuit board that is connected via solder ball 216 can be connected to the primary input port 218 of the "repeater" die 202. Repeater die 202 can provide identical data on output secondary port 220 and all non-repeater die 204, 206, and 208 can receive the repeated or duplicate data on a secondary input port such as ports 222, 224, and 226. Thus, non-repeater die 204, 206 and 208 can store redundant data. This fan out memory design can be utilized in a high performance/high speed system because lower capacitances and lower signal levels can be utilized by the system. Each port of each die can then drive individual signals to multiple locations thereby providing a large fan out.

When requested, die 204,206 and 208 can provide their stored data on a secondary output port such as secondary output ports 228, 230 and 232. Each die 202-208 can have a primary input port (INP), a secondary input port (INS), a primary output port (OUTP), and a secondary output port (OUTS).

An alternate embodiment with a specialized base die having input ports and output ports in different locations can utilize a less dense routing system (interposer 210) or less complex interposer 210. However, this specialized memory IC will have a relatively low manufacturing volume and are therefore be a relatively expensive component.

The interposer 210 can be assembled to a circuit board (not shown) via solder balls 216 and 214 and the interposer 210 can be glued to the circuit board with an epoxy material (not shown). The dies (202-208) can be soldered to the interposer 210 and the interposer 210 can be soldered to a circuit board. "Solder balls" can be utilized to separate the die 202-208 from the interposer cable components to relieve thermal stresses cause by differences in thermal expansion of the die 202-208 and the interposer 210. Additionally, the interposer 210 can have specific impedances to provide a robust low loss connection between the dies and the circuit board.

Figure 3:
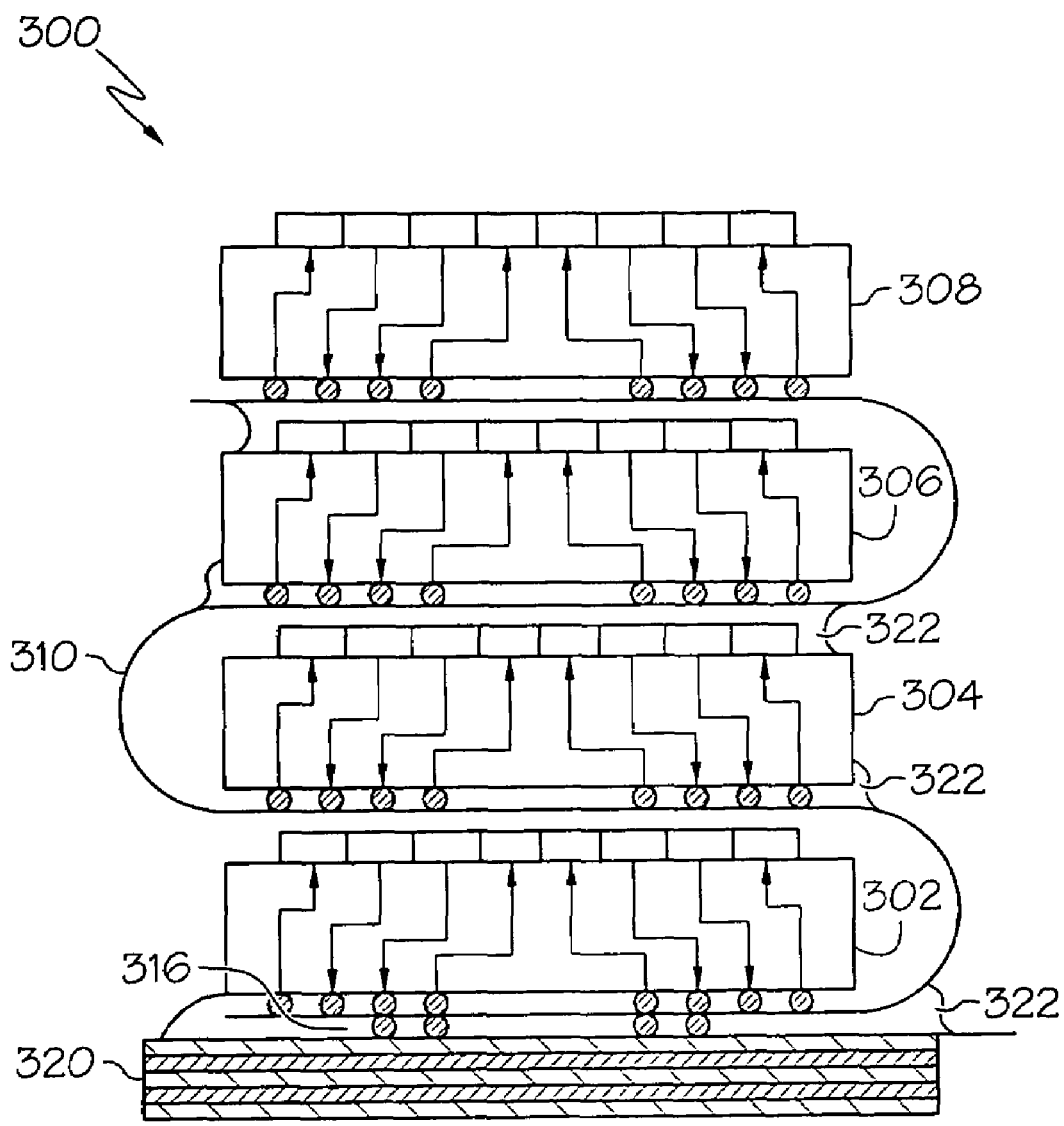
FIG. 3 depicts integrated circuit die in a stacked configuration.

FIG. 3 illustrates the elements of FIG. 2 in an assembly 300 having a stacked configuration by folding the linear configuration shown in FIG. 2. In FIG. 3, solder balls 316 such as solder balls 214 and 216 of FIG. 2 have been attached to a circuit board 320, and interposer 310 has been folded over onto itself "back-and-forth" three times such that the interposer cable "zig-zags" up the stack of die.

Interposer 310 can be flexible in the sense that it can undergo substantially elastic deformation in bending when subjected to reasonable strain values. For example, the interposer 310 can bend back upon itself forming a radius of less than a tenth of an inch without appreciable damage to the conductive traces within the interposer 310. Interposer 310 can be attached to a circuit board 320 utilizing a wave soldering process. Interposer 310 can be a polymeric layer clad with thin copper layers of varying widths.

The copper layers can be formed utilizing thermal compression bonding of copper foil. In one embodiment a Pyralux™ product from Dupont® could be utilized for the middle conductive layers of the interposer 310. As the assembly 300 is folded, epoxy 322 can be placed between the dies 302, 304, 306 and 308 the "bottom" surface of the interposer cable 302 and the circuit board 320 to secure the assembly 300 and make it rigid. After the assembly 300 is in place the assembly 300 can also be potted such that it can withstand extreme vibration without failure.

Figure 4:
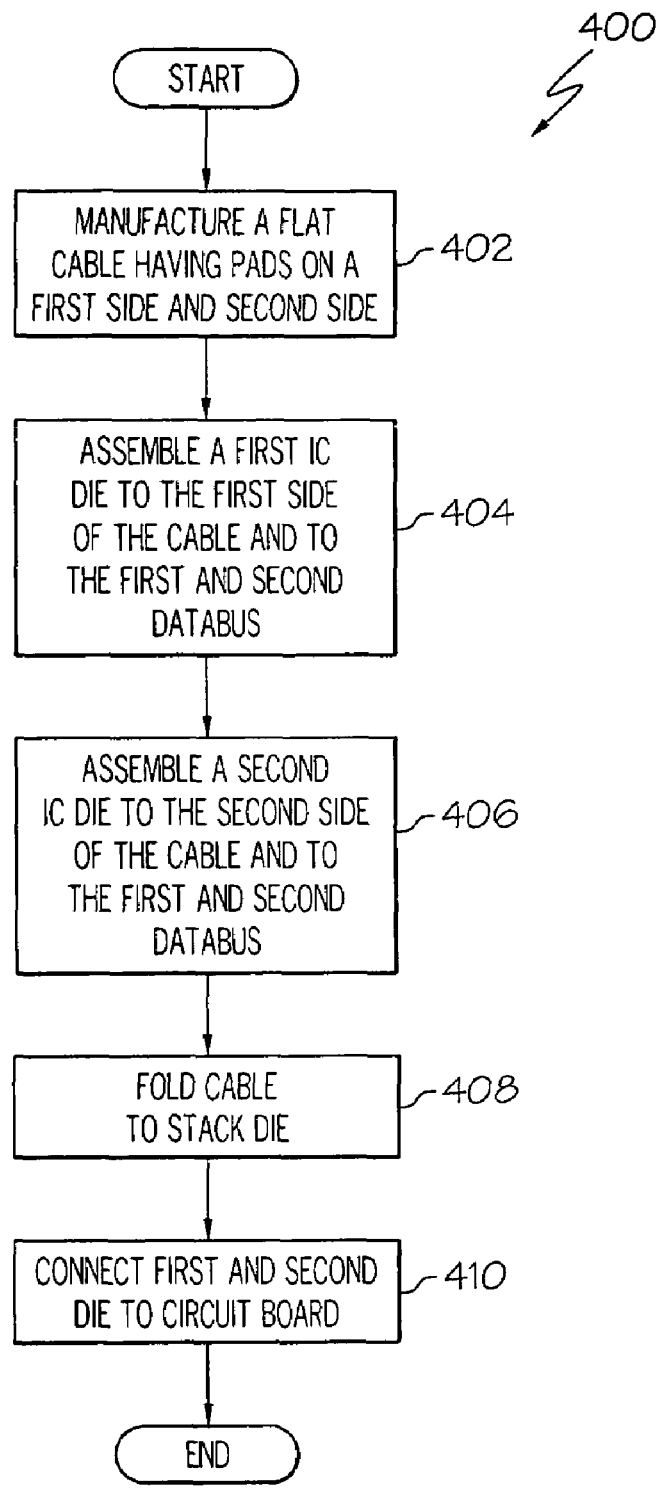
FIG. 4 illustrates a flow diagram of a method for manufacturing stacked integrated circuit dies.

Referring to FIG. 4, a method 400 for interconnecting circuits is disclosed. A flat cable with a first side and a second side and a plurality of conductors, vias, cuts splices and pads can be manufactured as illustrated by block 402. The manufactured cable can provide connections for a first data bus and a second data bus. The cable can be made out of small cooper foil that creates traces sandwiched between an insulative material. The traces can be enclosed in an epoxy, a polyamide or other insulative material and can have pads that selectively interconnect with the exterior of the cable such that similar die can be interconnected with the cable.

An IC die can be assembled to the first side of the cable and to the first and second data bus as illustrated in block 404. Another IC die can be assembled to the second side of the cable and to the first and second data bus as illustrated by block 406. Pads on the first and second IC die can be soldered to pads or vias on the cable during this assembly process. In addition the IC die can be glued to the cable or to a circuit bond on which the cable and the IC die are mounted.

As illustrated by block 408, the flat cable can be folded such that the first die is proximate to the second die. The cable can interconnect an output port of the first die such that the first die can supply data on the first data bus to the second die and the second die can store the data and an output port on the second die can supply the data back to an input port on the first die via the second data bus when requested.

As illustrated by block 410 the cable can be electrically and mechanically connected to the circuit board and the process can end thereafter. The cable can be soldered or electrically interconnected to a circuit board and the cable can be glued to the circuit board utilizing an epoxy. All of the electrical connections can be made utilizing a grid ball array. The solder balls can raise the cable off of the circuit board and can also raise the IC die off of cable such that thermal expansions at different rates will not fatigue the solder joints. The cable can be selected and interconnected such that the electrical paths are impedance matched to the output impedance of the IC die.

The present disclosure and some of its features have been described in detail for some embodiments. It should be understood that various changes, substitutions and alterations can be made herein without departing from the spirit and scope of the disclosure as defined by the appended claims. An embodiment of the disclosure may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. One of ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

What is claimed is:

1. A die set interconnection system comprising:
   a first integrated circuit die to perform as a base memory controller, the first integrated circuit die having a first electrode configuration including a primary input bus connection, a secondary input bus connection, a primary output bus connection and a secondary output bus connection to interconnect with a primary and secondary input bus and a primary and secondary output bus;
   a second integrated circuit die having the first electrode configuration, including a primary input bus connection, a secondary input bus connection, a primary output bus connection and a secondary output bus connection to interconnect with the primary and secondary input bus and the primary and secondary output bus; and
   a multilayer flexible cable having a first surface and a second surface and pads on the first surface and the second surface to interconnect the secondary output bus of the first integrated circuit die to the secondary input bus of the second integrated circuit die and to connect the primary output bus of the second integrated circuit die to the primary input bus on the first integrated circuit die.

2. The die set interconnection system of claim 1, wherein the multilayer flexible cable interface is folded to place the first integrated circuit die on top of the second integrated circuit die.

3. The die set interconnection system of claim 1, wherein the die set is connected in a fan out configuration.

4. The die set interconnection system of claim 1 wherein first integrated circuit die and the second integrated circuit die are function equivalently in a similar environment and the first integrated circuit die has primary input bus connection, a secondary input bus connection, a primary output bus connection and a secondary output bus connection that are configured in physically different locations than the primary input bus connection, a secondary input bus connection, a primary output bus connection and a secondary output bus connection of the second integrated circuit die.

5. The die set interconnection system of claim 1 wherein first integrated circuit die and the second integrated circuit die are mounted on the first side and the second side in an alternating configuration.

6. An integrated circuit interconnect system comprising:
   a flexible electrical interconnect member having a first side opposite a second side, the first side having a pad configuration mounted thereon and the second side having the pad configuration mounted thereon;
   a first integrated circuit die to perform as a base memory controller, the first integrated circuit die having a first set of electrodes mounted thereon disposed to mate with the pad configuration on the first side of the flexible electrical interconnect member including a primary input bus connection, a secondary input bus connection, a primary output bus connection and a secondary output bus; and
   a second integrated circuit die having a second set of electrodes mounted thereon disposed to mate with the pad configuration on the second side of the flexible electrical interconnect member wherein the first integrated circuit and the second integrated circuit are substantially identical, the second integrated circuit having a primary input bus connection, a secondary input bus connection, a primary output bus connection and a secondary output bus to interconnect with the primary and the secondary input bus and a the primary and the secondary output bus of the first integrated circuit to form a fan out interconnect of the first and second integrated circuit die.

7. The interconnect system of claim 6, further comprising a third integrated circuit die having a third set of electrodes disposed to connect with the first side of the flexible electrical interconnect member in a fan out configuration.

8. The interconnect system of claim 6, further comprising an interconnect circuit board to mount the first and second integrated circuit die and the flexible interconnect member, wherein the second integrated circuit die is placed in an inverted position such that the flexible electrical interconnect member is folded and forms a loop.

9. The interconnect system of claim 6, wherein the first and second integrated circuit die are interconnected by an input bus and an output bus to form a daisy chain topology.

10. The interconnect system of claim 6, wherein and the first integrated circuit die has primary input bus connection, a secondary input bus connection, a primary output bus connection and a secondary output bus connection that are configured in physically different locations than the primary input bus connection, a secondary input bus connection, a primary output bus connection and a secondary output bus connection of the second integrated circuit die.

11. The interconnect system of claim 6, wherein the flexible electrical interconnect has a controlled impedance.

12. The interconnect system of claim 6, wherein the interconnect system comprises a star signal distribution configuration.

13. The interconnect system of claim 6, wherein the flexible electrical interconnect comprises two layers of electrical conductors that run in parallel.

14. The interconnect system of claim 6, wherein the flexible electrical interconnect comprises one of vias, cuts, and splices.

* * * * *

UNITED STATES PATENT AND TRADEMARK OFFICE
CERTIFICATE OF CORRECTION

| | | |
|---|---|---|
| PATENT NO. | : 7,514,773 B2 | Page 1 of 1 |
| APPLICATION NO. | : 11/513850 | |
| DATED | : April 7, 2009 | |
| INVENTOR(S) | : Michael Leddige et al. | |

It is certified that error appears in the above-identified patent and that said Letters Patent is hereby corrected as shown below:

In column 10, line 23, in Claim 6, after "and" delete "a".

In column 10, line 40, in Claim 10, after "wherein" delete "and".

Signed and Sealed this

Sixteenth Day of June, 2009

JOHN DOLL
*Acting Director of the United States Patent and Trademark Office*